(12) United States Patent
Pisek et al.

(10) Patent No.: US 7,984,368 B2
(45) Date of Patent: Jul. 19, 2011

(54) METHOD AND SYSTEM FOR INCREASING DECODER THROUGHPUT

(75) Inventors: Eran Pisek, Plano, TX (US); Yan Wang, Plano, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 1174 days.

(21) Appl. No.: 11/712,653

(22) Filed: Mar. 1, 2007

(65) Prior Publication Data

US 2008/0059772 A1    Mar. 6, 2008

Related U.S. Application Data

(60) Provisional application No. 60/841,876, filed on Sep. 1, 2006, provisional application No. 60/858,093, filed on Nov. 10, 2006.

(51) Int. Cl.
*H03M 13/03* (2006.01)

(52) U.S. Cl. .................................................... 714/794
(58) Field of Classification Search .............. 714/786, 714/794–796
See application file for complete search history.

(56) References Cited

U.S. PATENT DOCUMENTS

| | | | |
|---|---|---|---|
| 6,343,368 B1 * | 1/2002 | Lerzer | 714/796 |
| 6,484,283 B2 * | 11/2002 | Stephen et al. | 714/786 |
| 6,678,843 B2 * | 1/2004 | Giulietti et al. | 714/701 |
| 7,343,530 B2 * | 3/2008 | Shin | 714/702 |

* cited by examiner

*Primary Examiner* — Shelly A Chase

(57) ABSTRACT

A method for increasing decoder throughput is provided that includes dividing a data block into a plurality of segments. For each of the segments, the segment is decoded by performing a plurality of processes for the segment. At least one process for a current segment is performed while at least one process for a preceding segment is performed. Also, at least one process for the current segment is performed while at least one process for a subsequent segment is performed.

27 Claims, 11 Drawing Sheets

METHOD AND SYSTEM FOR INCREASING DECODER THROUGHPUT

CROSS-REFERENCE TO RELATED APPLICATION AND CLAIM OF PRIORITY

This application is related to U.S. Provisional Patent No. 60/841,876, filed Sep. 1, 2006, titled "LTE Turbo Crisp" and U.S. Provisional Patent No. 60/858,093, filed Nov. 10, 2006, titled "Method and Apparatus For Increasing Turbo Decoder Throughput In Software Defined Radio Systems". Provisional Patent Nos. 60/841,876 and 60/858,093 are assigned to the assignee of this application and are incorporated by reference as if fully set forth herein. This application claims priority under 35 U.S.C. §119(e) to Provisional Patent Nos. 60/841,876 and 60/858,093.

This application is related to U.S. Patent Application Ser. No. 11/123,313, filed on May 6, 2005, titled "Context-based Operation Reconfigurable Instruction Set Processor and Method of Operation" and to U.S. patent application Ser. No. 11/501,335, filed Aug. 9, 2006, titled "Generic Maximum A-posteriori Probability Decoder For Use In Software-Defined Radio Systems." Application Ser. Nos. 11/123,313 and 11/501,335 are assigned to the assignee of this application and are incorporated by reference into this application as if fully set forth herein.

TECHNICAL FIELD OF THE INVENTION

The present application relates generally to decoding algorithms and, more specifically, to a method and system for increasing decoder throughput.

BACKGROUND OF THE INVENTION

Many wireless communication standards use block codes, such as turbo codes, to increase the performance of channel decoding. Newly developed standards, such as Long Term Evolution (LTE), increase the need for support for higher data rates (e.g., above 50 Mbps). Current turbo decoder solutions for maximum a-posteriori probability (MAP) decoders fail to support the required high data rate throughput without hardware duplication, parallel processing (and its associated high complexity design) and/or significant BER/FER performance degradation. For example, a single, WCDMA MAP decoder machine currently supports four cycles/bit/iteration. In addition, software-defined radio (SDR) systems that support both WiMax and cellular standards, such as LTE, WCDMA, CDMA and the like, currently need to be separated into two different machines or to support both standards in the lower rate (such as WCDMA). Therefore, there is a need in the art for an improved method and system for increasing decoder throughput.

SUMMARY OF THE INVENTION

A method for increasing decoder throughput is provided. According to an advantageous embodiment, the method includes dividing a data block into a plurality of segments. For each of the segments, the segment is decoded by performing a plurality of processes for the segment. At least one process for a current segment is performed while at least one process for a preceding segment is performed. Also, at least one process for the current segment is performed while at least one process for a subsequent segment is performed.

According to another embodiment of the present disclosure, a method for increasing decoder throughput is provided that includes dividing a data block into a plurality of segments. For each of the segments, the segment is decoded by performing a plurality of processes for the segment. The processes include a pre-calculation process, a first calculation process, a second calculation process, and a post-calculation process. The pre-calculation process for a current segment is performed while the second calculation process for a preceding segment is performed. The post-calculation process for the current segment is performed while the first calculation process for a subsequent segment is performed.

According to yet another embodiment of the present disclosure, a system for increasing decoder throughput is provided that includes a lambda calculation block, a lambda memory, and a temporary lambda memory. The lambda calculation block is operable to calculate a plurality of lambda values for use in decoding each of a plurality of segments of a data block. The lambda memory is coupled to the lambda calculation block and is operable to store the lambda values calculated by the lambda calculation block. The temporary lambda memory is coupled to the lambda calculation block and to the lambda memory. The temporary lambda memory is operable to store temporarily a portion of the lambda values calculated by the lambda calculation block.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the term "each" means every one of at least a subset of the identified items; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 10, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged processing system.

In the descriptions that follow, the reconfigurable maximum a-posteriori probability (MAP) decoder disclosed herein is implemented as part of a turbo decoder that provides a high degree of parallelism to support high data rate standards and that provides increased throughput. However, it will be understood that the embodiment of the reconfigurable MAP decoder in a turbo decoder is by way of illustration only and should not be construed to limit the scope of this disclosure. The reconfigurable MAP decoder capable of providing increased throughput disclosed herein may easily be adapted for use in decoders other than turbo decoders.

The reconfigurable MAP decoder and the reconfigurable turbo decoder support multimode operation for decoding in different communication standards, such as WCDMA, CDMA2000, IEEE-802.16e (e.g., WiBro) and/or other suitable standards. The disclosed MAP and turbo decoders also provide adaptability to support different data rates. WiBro and WCDMA/HSDPA operate at many different data rates. The disclosed MAP and turbo decoder architectures are optimized not only for the maximum data rates but also for different ranges of data rates.

In one embodiment of the disclosure, the reconfigurable MAP and turbo decoders described herein may be implemented using a context-based operation reconfigurable instruction set processor (CRISP) device. CRISP devices are described in detail in U.S. patent application Ser. No. 11/123,313, which was incorporated by reference above.

The present disclosure introduces a novel method of increasing throughput for a decoder that involves, for processing a current segment of a data block, reading a portion of the lambda values during a preceding segment and writing a portion of the lambda values during a subsequent segment. Although the unique scheduling process is implemented in a turbo decoder in the embodiments described herein, this is by way of illustration only and should not be construed so as to limit the scope of the present disclosure. Those skilled in the art will appreciate that the scheduling process disclosed herein may easily be adapted for use in other types of block decoders.

Figure 1:
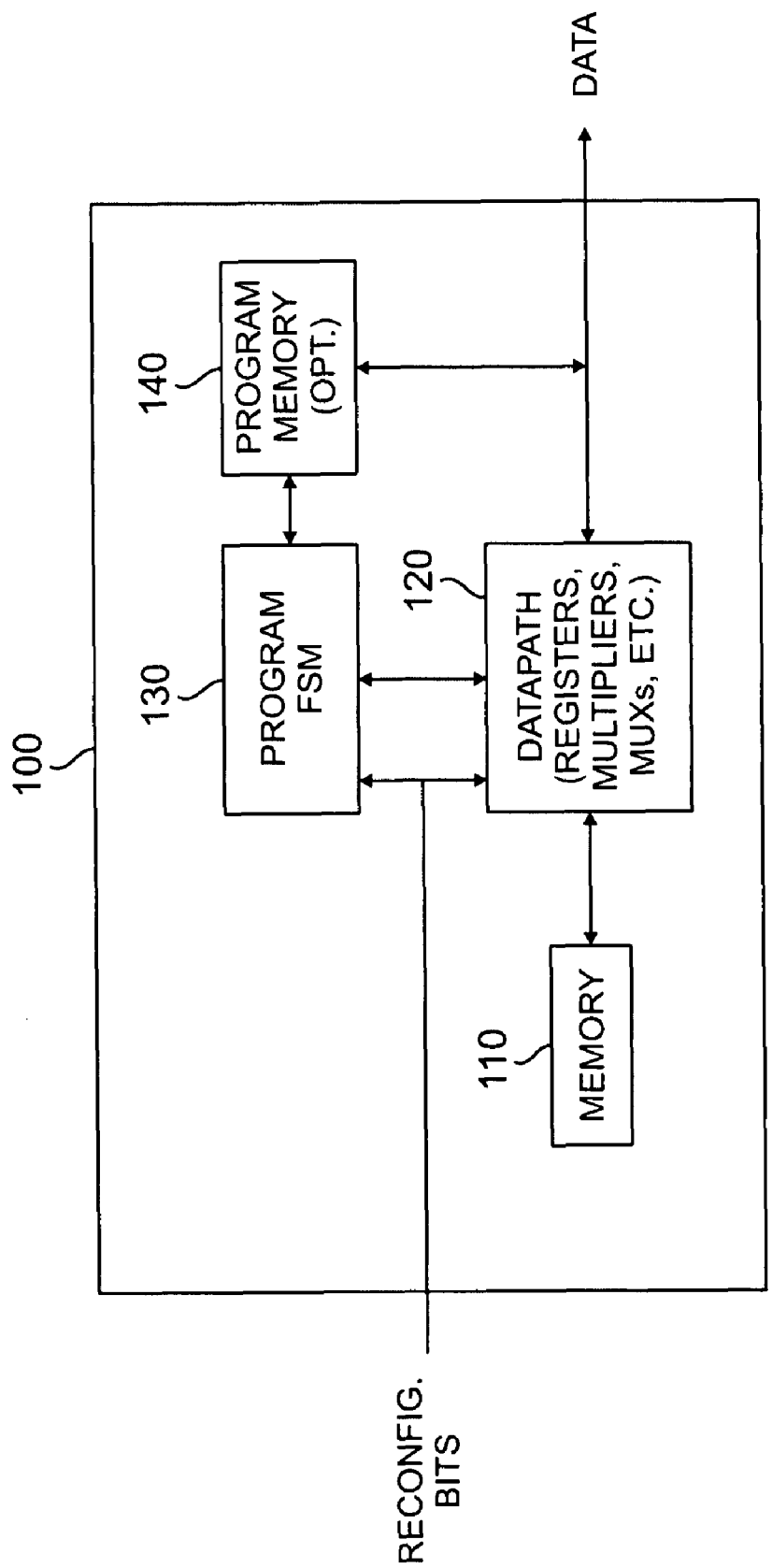
FIG. 1 is a high-level block diagram of a context-based operation reconfigurable instruction set processor (CRISP) that may be used to implement a reconfigurable maximum a-posteriori probability (MAP) decoder that is capable of providing increased throughput according to the principles of the disclosure.

FIG. 1 is a high-level block diagram of CRISP 100, which may be used to implement a reconfigurable MAP decoder that is capable of providing increased throughput according to the principles of the present disclosure. CRISP 100 comprises memory 110, programmable data path circuitry 120, programmable finite state machine 130, and optional program memory 140. A context is a group of instructions of a data processor that are related to a particular function or application, such as turbo decoding instructions. As described in U.S. patent application Ser. No. 11/123,313, CRISP 100 implements only a subset of context-related instructions in an optimum manner.

CRISP 100 defines the generic hardware block that usually consists of higher level hardware processor blocks. The principle advantage to CRISP 100 is that CRISP 100 breaks down the required application into two main domains, a control domain and a data path domain, and optimizes each domain separately. By performing turbo decoding in CRISP 100, the disclosed turbo decoder reduces the problems related to flexibility and power consumption that affect conventional turbo decoders.

The control domain is implemented by programmable finite state machine 130, which may comprise a DSP, an MCU or another prior art device. Programmable FSM 130 is configured by reconfiguration bits received from an external controller (not shown). Programmable FSM 130 may execute a program stored in associated optional program memory 140. The program may be stored in program memory 140 via the DATA line from an external controller (not shown). Memory 110 is used to store application data used by data path circuitry 120.

Programmable data path circuitry 120 is divided into sets of building blocks that perform particular functions (e.g., registers, multiplexers, multipliers, and the like). Each of the building blocks is both reconfigurable and programmable to allow maximum flexibility. The division of programmable data path circuitry 120 into functional blocks depends on the level of reconfigurability and programmability required for a particular application.

Since different contexts are implemented by separate CRISP devices that work independently of other CRISP devices, implementing a turbo decoder using one or more CRISP devices provides an efficient power management scheme that is able to shut down a CRISP when the CRISP is not required. This assures that only the CRISPs that are needed at a given time are active, while other idle CRISPs do not consume significant power.

Figure 2:
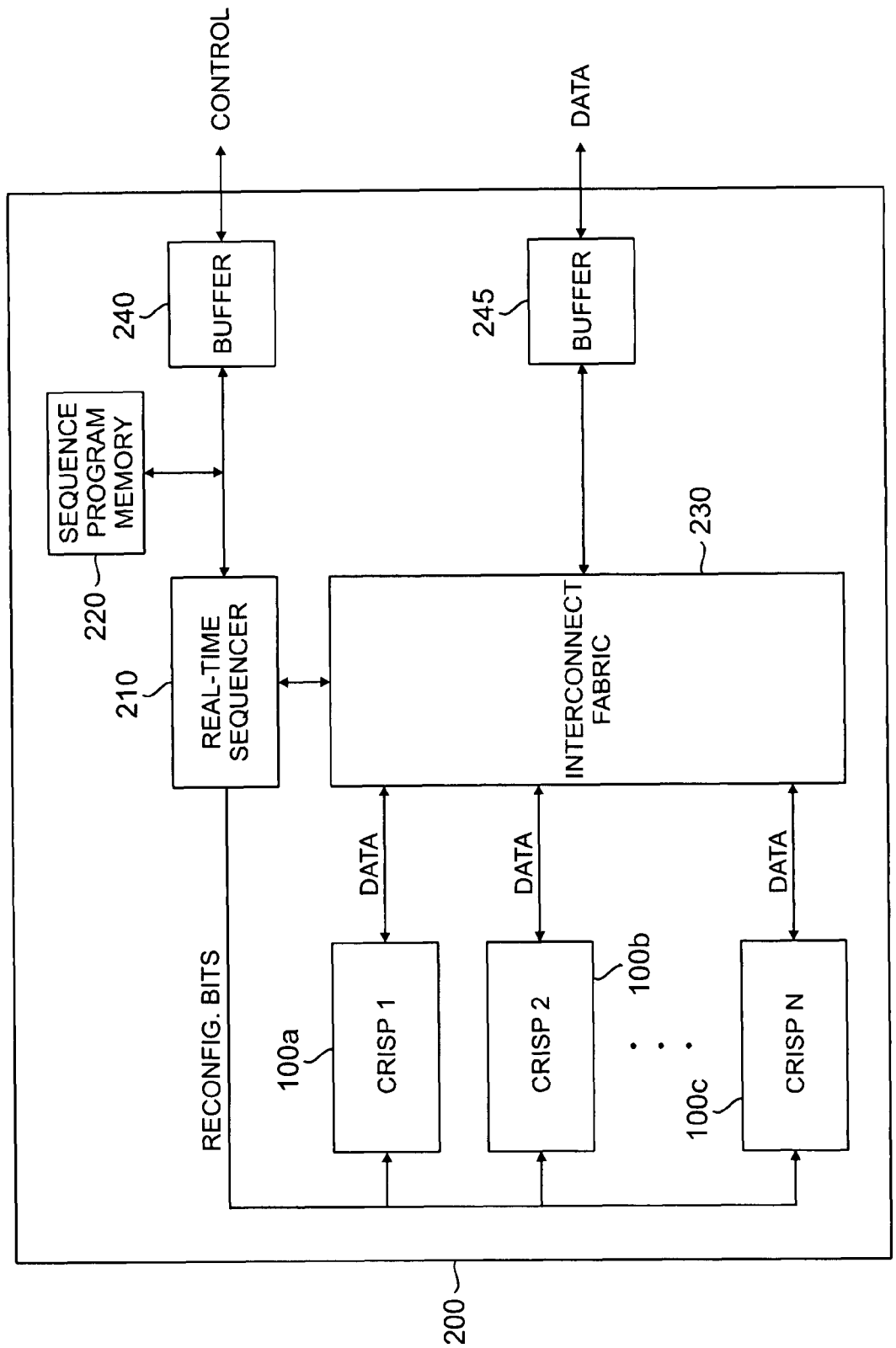
FIG. 2 is a high-level block diagram of a reconfigurable processing system according to the principles of the disclosure.

FIG. 2 is a high-level block diagram of reconfigurable processing system 200 according to one embodiment of the present disclosure. Reconfigurable processing system 200 comprises N CRISPS, such as CRISPs 100a, 100b, and 100c, which are arbitrarily labeled CRISP 1, CRISP 2 and CRISP N. Reconfigurable processing system 200 further comprises real-time sequencer 210, sequence program memory 220, programmable interconnect fabric 230, and buffers 240 and 245.

Reconfiguration bits may be loaded into CRISPs 100a, 100b, and 100c from the CONTROL line via real-time sequencer 210 and buffer 240. A control program may also be loaded into sequence program memory 220 from the CONTROL line via buffer 240. Real-time sequencer 210 sequences the contexts to be executed by each one of CRISPs 100a-c by retrieving program instructions from program memory 220 and sending reconfiguration bits to CRISPs 100a-c. In one embodiment, real-time sequencer 210 may comprise a stack processor, which is suitable to operate as a real-time scheduler due to its low latency and simplicity.

Reconfigurable interconnect fabric 230 provides connectivity between each one of CRISPs 100a-c and an external DATA bus via bi-directional buffer 245. In one embodiment of the present disclosure, each one of CRISPs 100a-c may act as a master of reconfigurable interconnect fabric 230 and may initiate address access. The bus arbiter for reconfigurable interconnect fabric 230 may be internal to real-time sequencer 210.

In one embodiment, reconfigurable processing system 200 may be a cell phone or a similar wireless device or may be a data processor for use in a laptop computer. In a wireless device embodiment based on a software-defined radio (SDR) architecture, each one of CRISPs 100a-c is responsible for executing a subset of context-related instructions that are associated with a particular reconfigurable function. For example, CRISP 100a may be configured to execute context-related instructions that process CDMA baseband signals or OFDMA baseband signals. CRISP 100b may be configured to execute context-related instructions that act as a memory controller. CRISP 100c may be configured to execute context-related instructions that perform turbo decoding or Viterbi decoding.

Since CRISP devices are largely independent and may be run simultaneously, a turbo decoder implemented using one or more CRISP devices has the performance advantage of parallelism without incurring the full power penalty associated with running parallel operations. The loose coupling and independence of CRISP devices allows them to be configured for different systems and functions that may be shut down separately.

Figure 3:
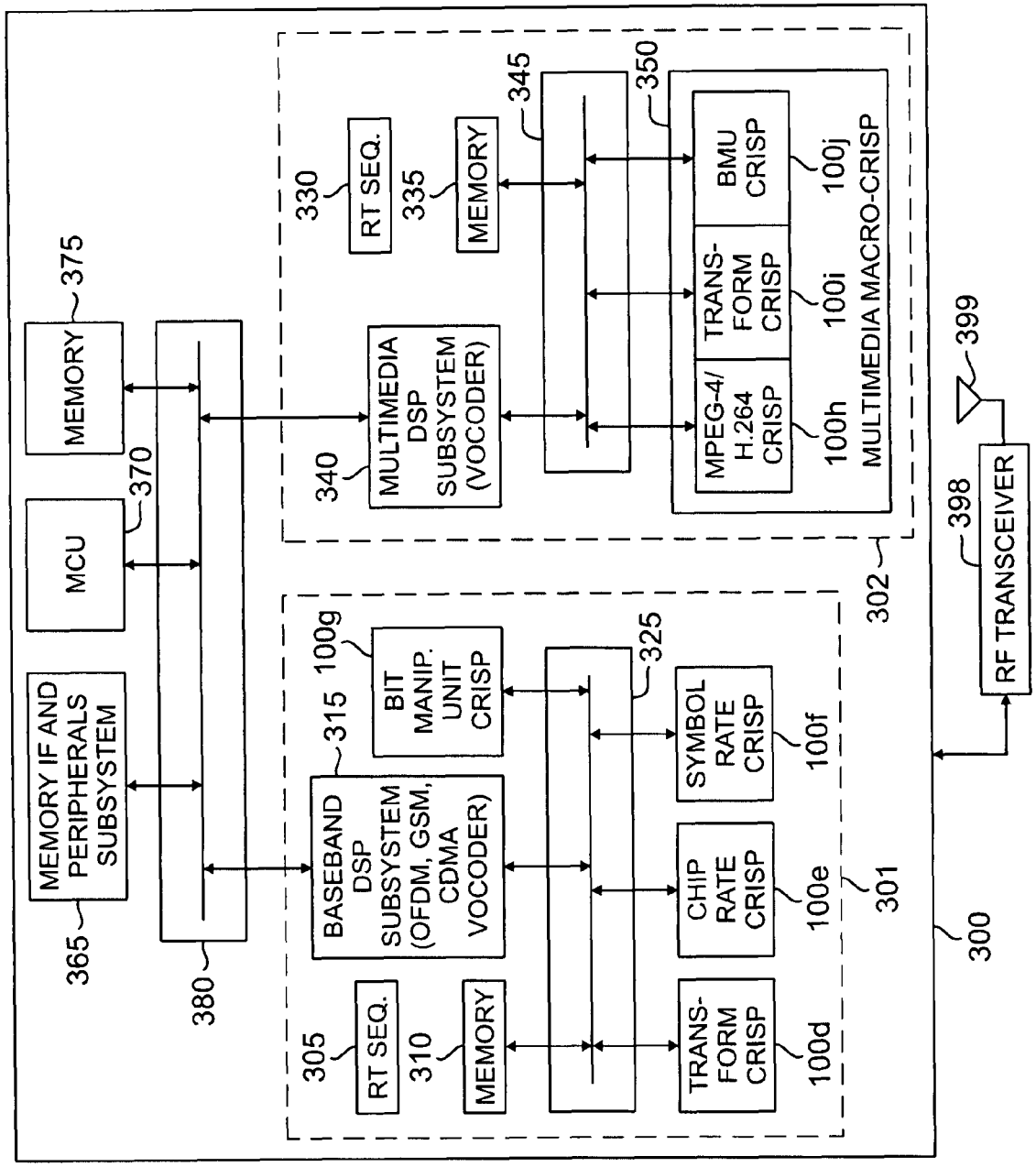
FIG. 3 is a high-level block diagram of a multi-standard software-defined radio (SDR) system that implements a reconfigurable MAP decoder capable of providing increased throughput according to the principles of the disclosure.

FIG. 3 is a high-level block diagram of multi-standard SDR system 300, which implements a reconfigurable MAP decoder that provides increased throughput by segmenting a data block and overlapping the processing of each segment according to the principles of the disclosure. SDR system 300 may comprise a wireless terminal (or mobile station, subscriber station, etc.) that accesses a wireless network, such as, for example, a GSM or CDMA cellular telephone, a PDA with WCDMA, IEEE-802.11x, OFDM/OFDMA capabilities, or the like.

Multi-standard SDR system 300 comprises baseband subsystem 301, applications subsystem 302, memory interface (IF) and peripherals subsystem 365, main control unit (MCU) 370, memory 375, and interconnect 380. MCU 370 may comprise, for example, a conventional microcontroller or a microprocessor (e.g., x86, ARM, RISC, DSP, etc.). Memory IF and peripherals subsystem 365 may connect SDR system 300 to an external memory (not shown) and to external peripherals (not shown). Memory 375 stores data from other components in SDR system 300 and from external devices (not shown). For example, memory 375 may store a stream of incoming data samples associated with a down-converted signal generated by radio frequency (RF) transceiver 398 and antenna 399 associated with SDR system 300. Interconnect 380 acts as a system bus that provides data transfer between subsystems 301 and 302, memory IF and peripherals subsystem 365, MCU 370, and memory 375.

Baseband subsystem 301 comprises real-time (RT) sequencer 305, memory 310, baseband DSP subsystem 315, interconnect 325, and a plurality of special purpose CRISPs, including transform CRISP 100d, chip rate CRISP 100e, symbol rate CRISP 100f, and bit manipulation unit (BMU) CRISP 100g. By way of example, transform CRISP 100d may implement a Fast Fourier Transform (FFT) function, chip rate CRISP 100e may implement a correlation function for a CDMA signal, and symbol rate CRISP 100f may implement a turbo decoder function or a Viterbi decoder function.

In such an embodiment, transform CRISP 100d may receive samples of an intermediate frequency (IF) signal stored in memory 375 and perform an FFT function that generates a sequence of chip samples at a baseband rate. Next, chip rate CRISP 100e receives the chip samples from transform CRISP 100d and performs a correlation function that generates a sequence of data symbols. Next, symbol rate CRISP 100f receives the symbol data from chip rate CRISP 100e and performs turbo decoding or Viterbi decoding to recover the baseband user data. The baseband user data may then be used by applications subsystem 302.

In one embodiment of the present disclosure, symbol rate CRISP 100f may comprise two or more CRISPs that operate in parallel. Also, by way of example, BMU CRISP 100g may implement such functions as variable length coding, cyclic redundancy check (CRC), convolutional encoding, and the like. Interconnect 325 acts as a system bus that provides data transfer between RT sequencer 305, memory 310, baseband DSP subsystem 315 and CRISPs 100d-100g.

Applications subsystem 302 comprises real-time (RT) sequencer 330, memory 335, multimedia DSP subsystem 340, interconnect 345, and multimedia macro-CRISP 350. Multimedia macro-CRISP 350 comprises a plurality of special purpose CRISPs, including MPEG-4/H.264 CRISP 100h, transform CRISP 100i, and BMU CRISP 100j. In one embodiment of the disclosure, MPEG-4/H.264 CRISP 100h performs motion estimation functions and transform CRISP 100i performs a discrete cosine transform (DCT) function. Interconnect 380 provides data transfer between RT sequencer 330, memory 335, multimedia DSP subsystem 340, and multimedia macro-CRISP 350.

In the embodiment in FIG. 3, the use of CRISP devices enables applications subsystem 302 of multi-standard SDR system 300 to be reconfigured to support multiple video standards with multiple profiles and sizes. Additionally, the use of CRISP devices enables baseband subsystem 301 of multi-standard SDR system 300 to be reconfigured to support multiple air interface standards. Thus, SDR system 300 is able to operate in different types of wireless networks (e.g., CDMA, GSM, 802.11x, etc.) and can execute different types of video and audio formats. However, the use of CRISPS according to the principles of the present disclosure enables SDR system 300 to perform these functions with much lower power consumption than conventional wireless devices having comparable capabilities.

Figure 4:
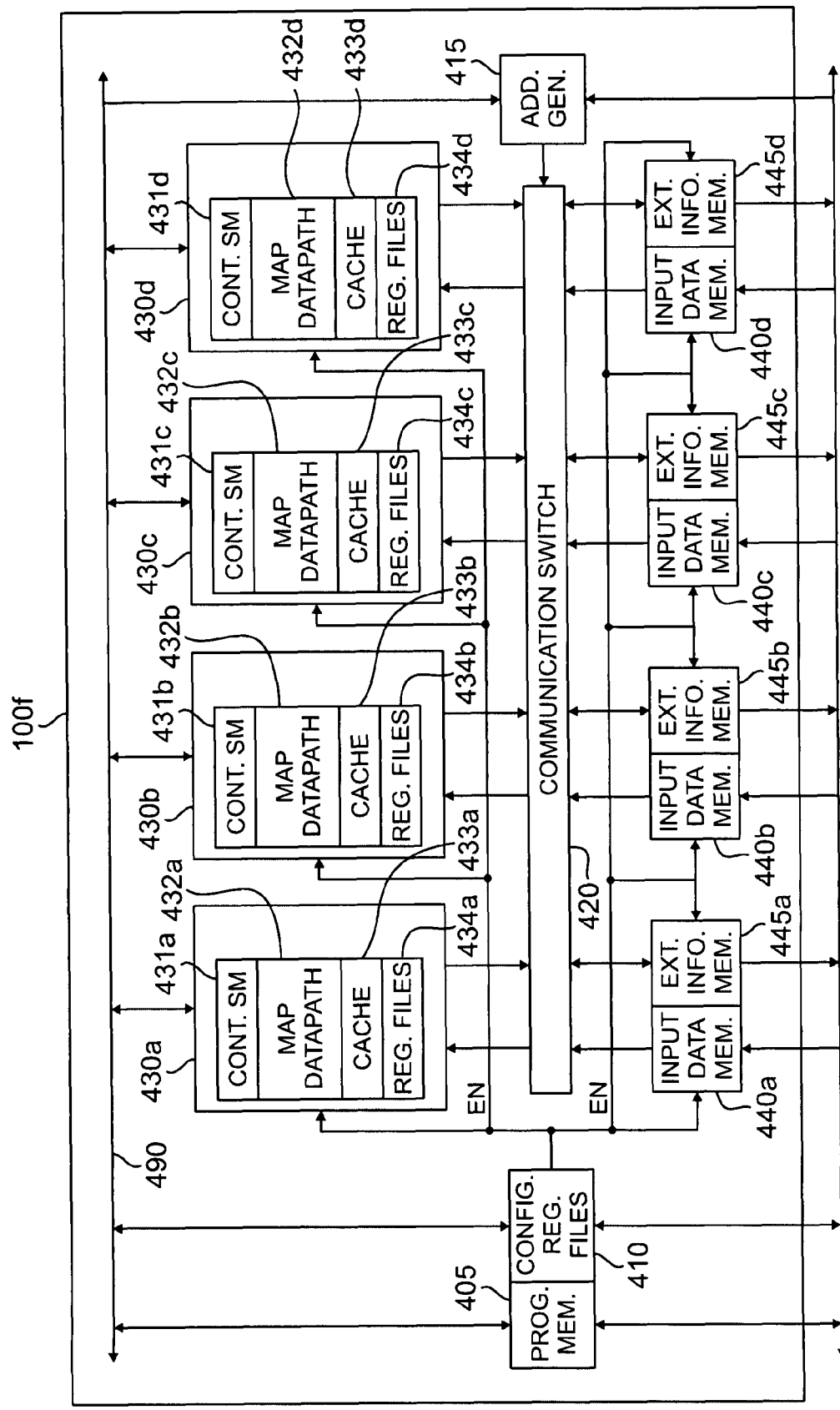
FIG. 4 is a block diagram of a reconfigurable turbo decoder implemented in a CRISP according to the principles of the disclosure according to the principles of the disclosure.

FIG. 4 is a block diagram of a reconfigurable turbo decoder implemented in CRISP 100f according to the principles of the disclosure. Turbo decoder CRISP 100f comprises program memory 405, configuration register files 410, address generator 415, communication switch 420, processing units 430a-430d, input data memories 440a-440d, extrinsic information memories 445a-445d, and internal bus 490. Each one of processing units 430a-430d comprises a control state machine (SM), a MAP datapath, a cache, and control register files. By way of example, processing unit 430a comprises control state machine 431a, MAP datapath 432a, cache 433a, and control register files 434a. Although four processing units 430 are illustrated in FIG. 4, this is by way of example only. Other embodiments of turbo decoder CRISP 100f may implement less than four processing units 430 or more than four processing units 430.

A conventional MAP turbo decoder architecture generally comprises two primary functional blocks: i) soft-input, soft-output (SISO) stages that implement an a-posteriori probability (APP) algorithm; and ii) an interleaver/de-interleaver that scrambles the data according to the interleaving rules followed by the encoder in the transmitting device. Other blocks are required for the implementation of the decoder, such as a RAM (random-access memory) for storing data from each iteration of the decoder. Turbo decoder CRISP 100f includes all the building blocks of a conventional MAP turbo decoder. In one embodiment, each one of MAP datapaths 432a-432d implements a sliding window MAP algorithm. However, alternate embodiments of turbo decoder CRISP 100f may implement non-sliding window MAP algorithms.

In turbo decoder CRISP 100f, MAP datapaths 432a, 432b, 432c and 432d temporarily store the values of $\alpha$ (alpha), $\beta$ (beta), and $\lambda$ (lambda) in caches 433a, 433b, 433c, and 433d. The extrinsic information (i.e., the $\lambda$ values) from each iteration for each decoding block is stored in extrinsic information memories 445a, 445b, 445c and 445d via communication switch 420. In one embodiment, MCU 370 loads a configuration program and configuration data into turbo decoder CRISP 100f via an external system bus (i.e., interconnect 325). The configuration program is stored in program memory 405. MCU 370 loads the configuration data into configuration register files 410 and control register files 434a-434d in order to initialize the register files. Configuration register files 410 and control register files 434a-434d are used to control which processing units 430a-430d, input data memories 440a-440d, and extrinsic information memories 445a-445d are used in an application. Configuration register files 410 provide enable (EN) signals to control processing units 430, input data memories 440, and extrinsic information memories 445. Turbo decoder CRISP 100f reads input data samples and writes decoded output data via the system bus (i.e., interconnect 325).

In order to achieve high decoding rates, turbo decoder CRISP 100f implements N parallel processing units 430a-430d. In this example, N=4. Processing units 430a-430d are independent and essentially identical to each other. Each one of processing units 430a-430d is capable of connecting to each one of input data memories 440a-440d and extrinsic information memories 445a-445d via communication switch 420. For higher data rate standards, all of processing units 430a-430d may operate simultaneously and in parallel. For lower data rate standards, one or more of processing units 430a-430d may be set to a sleep mode (i.e., deactivated or disabled) in order to reduce power consumption.

As noted above, each one of processing units 430a-430d comprises control state machine 431, MAP datapath 432, cache 433 and control register files 434. In one embodiment of turbo decoder CRISP 100f, each processing unit 430 processes two soft input data samples at a time. The two soft input data samples correspond to two data symbols. In one embodiment, each soft input data sample may comprise 8 bits. MAP datapath 432 performs both forward and backward recursions over the trellis. During the forward recursion and optionally also during the backward recursion, both the input symbol and the extrinsic ($\lambda$) information must be accessed to compute the branch metric, $\gamma$ (gamma). In order to reduce memory access power consumption, the $\gamma$ value may be computed and stored in cache 433 in each processing unit 430. If the values of $\alpha$, $\beta$, and $\lambda$ are not calculated simultaneously, the $\alpha$ value may also be stored in cache 433 to reduce data movement and power consumption.

MAP datapath 432 may compute the $\alpha$, $\beta$, and $\lambda$ values in parallel or in consecutive (or sequential) order. Parallel execution is faster but requires more die space and power consumption. Consecutive processing incurs longer delays but requires less die space and less power consumption. In one embodiment, each one of MAP datapaths 432a-432d computes the $\alpha$, $\beta$, and $\lambda$ values sequentially. Control state machine 431 decodes instructions from program memory received via internal bus 490 and controls the overall operation and configuration of processing unit 430. Since turbo decoder CRISP 100f may compute large instruction loops, control state machine 431 may use a hardware loop to reduce overhead and power consumption.

There are eight memory blocks in turbo decoder CRISP 100f: four input data memories 440a that hold the input data (or symbol) samples and four extrinsic information memories 445 that hold the extrinsic information (i.e., $\lambda$ values) generated in each half iteration of the turbo decoder. The eight memory blocks are divided into four groups. Each memory group includes one input data memory 440 and one extrinsic information memory 445. By way of example, input data memory 440a and extrinsic information memory 445a form a first memory group, input data memory 440b and extrinsic information memory 445b form a second memory group, and so forth.

Each one of processing units 430a-430d reads and writes to one memory group at a time. Each one of processing units 430a-430d is capable of writing to each one of the memory groups. Thus, none of the memory groups is dedicated to a specific processing unit 430. For example, processing unit 430a may be connected by communication switch 420 to a first memory group (e.g., memories 440a and 445a) during one memory cycle and may read from or write to another memory group (e.g., memories 440c and 445c) during another memory cycle.

Communication switch 420 dynamically controls the connections between processing units 430a-430d and the memory groups comprised of memories 440a-440d and memories 445a-445d. The connection order or pattern is determined by the operation of address generator 415. Thus, communication switch 420 performs the interleaver and de-interleaver operations for a MAP decoder. In one embodiment of the disclosure, address generator 415 may be implemented by a memory. In such an embodiment, the external control DSP/MCU, such as MCU 370, pre-computes offline the interleaver pattern of the turbo decoder and writes the interleaver pattern to the memory of address generator 415 during an initialization phase. In another embodiment of the disclosure, address generator 415 may be designed to generate the interleaver pattern in real time. According to the principles of the disclosure, MAP datapaths 432a-d are reconfigurable devices that may be modified to operate in turbo decoders or other types of decoders and may be modified to operate under different RF protocols. Thus, MAP datapaths 432a-d provide a generic architecture to support not only $\alpha$ (alpha), $\beta$ (beta), $\lambda$ (lambda), and $\gamma$ (gamma) calculations but also different communication systems that use MAP decoders.

Figure 5:
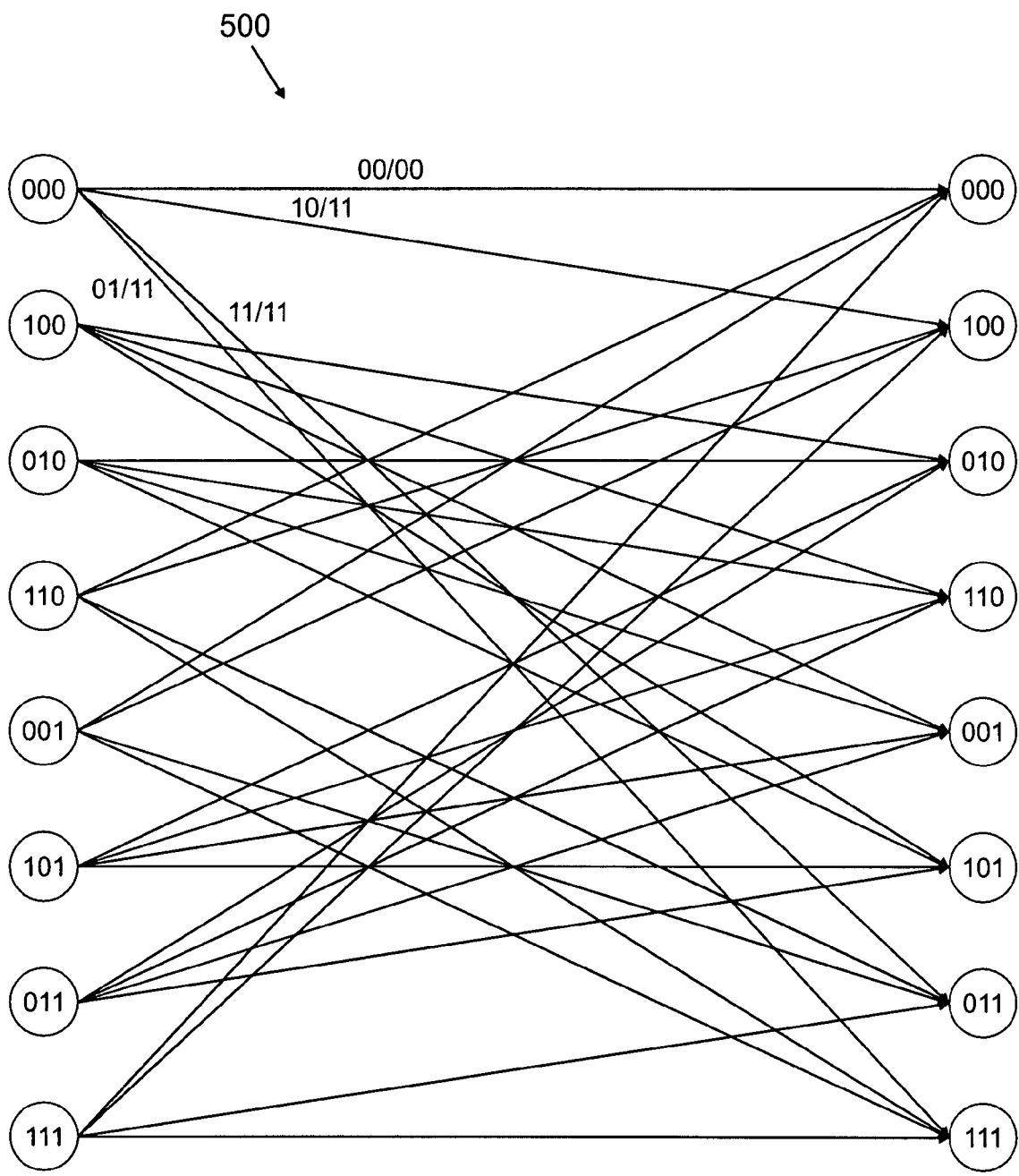
FIG. 5 is an example of a trellis diagram for a WiBro wireless network.

A MAP algorithm may be represented by a trellis. Different communication systems, such as WCDMA, WiBro, and the like, use different trellises. FIG. 5 illustrates an example of a trellis 500 for a WiBro wireless network that may be implemented by reconfigurable MAP datapaths 432a-d. Inside trellis 500 in FIG. 5, alpha, beta and lambda are calculated in either the forward direction or the backward direction. It is noted that there are eight states in trellis 500 and that there are four paths leading from a state at time t to a state at time t+1. This means there are 32 possible paths between states in trellis 500.

As is well known, a conventional turbo encoder uses two constituent encoders. A first encoder receives an original bit stream and generates a first parity bit stream. A second encoder receives an interleaved copy of the original bit stream and generates a second parity bit stream. The data transmitted by the turbo encoder comprises the original bit stream, the first parity bits from the first encoder, and the second parity bits from the second encoder.

Figure 6A:
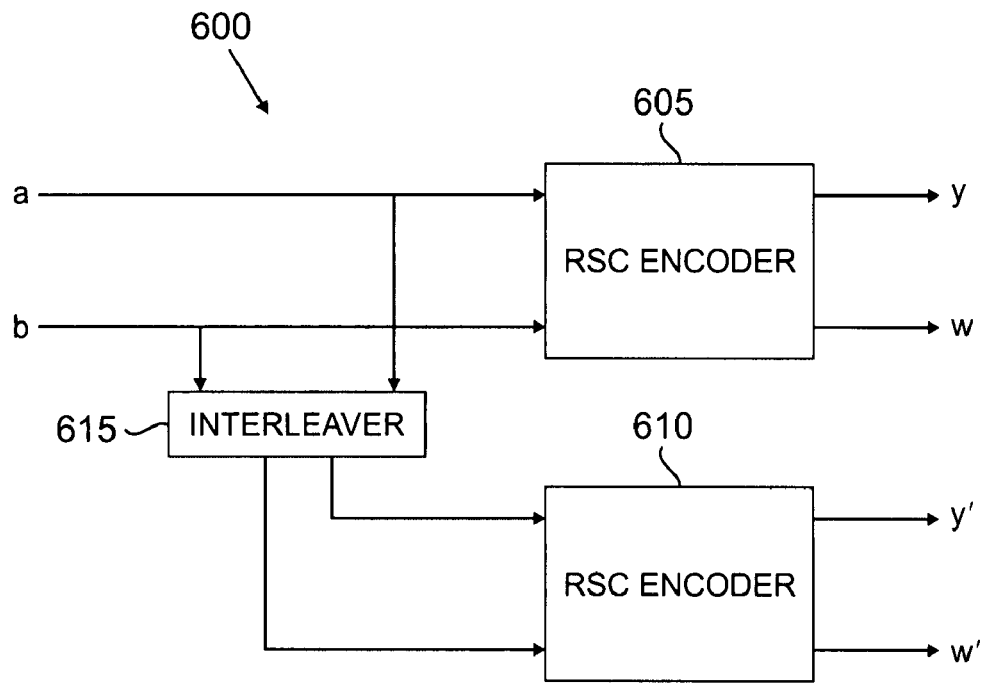
FIG. 6A is a high-level block diagram illustrating a duo-binary encoder according to one embodiment of the disclosure.

FIG. 6A is a high-level block diagram illustrating duo-binary encoder 600 according to one embodiment of the present disclosure. Duo-binary encoder 600 comprises recursive systematic code (RSC) encoders 605 and 610 and interleaver 615. In a duo-binary encoder (e.g., WiBro mode), a first sequence of the inputs a and b is applied to RSC encoder 605 and a second, interleaved sequence of the inputs a and b is applied to RSC encoder 610. The first encoder (RSC encoder 605) outputs the first parity bit stream (y, w), and the second encoder (RSC encoder 610) outputs the second parity bit stream (y', w').

Figure 6B:
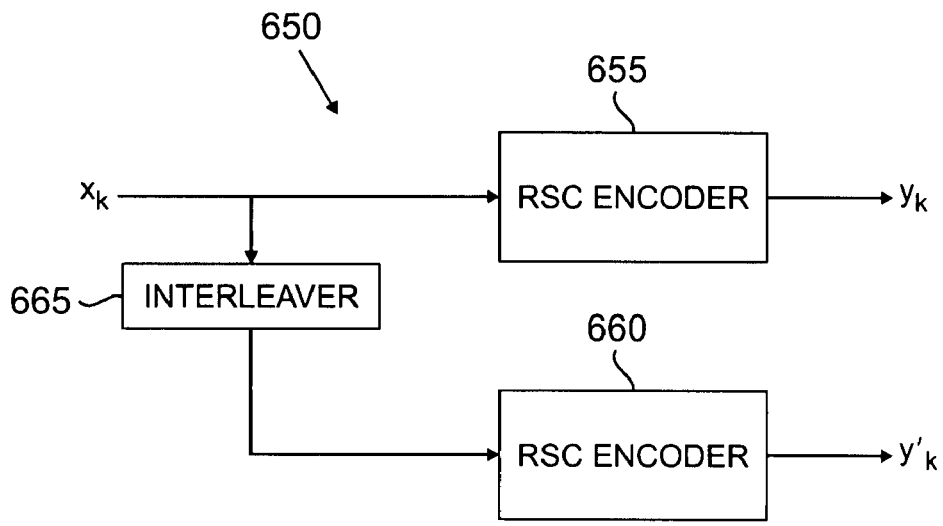
FIG. 6B is a high-level block diagram illustrating a binary encoder according to one embodiment of the disclosure.

FIG. 6B is a high-level block diagram illustrating binary encoder 650 according to one embodiment of the present disclosure. Binary encoder 650 comprises RSC encoders 655 and 660 and interleaver 665. In a binary turbo encoder (e.g., WCDMA mode), a first sequence of inputs $x_k$ is applied to RSC encoder 655 and a second, interleaved sequence of the inputs $x_k$ is applied to RSC encoder 660. The first encoder (RSC encoder 655) outputs the first parity bit stream $y_k$ and the second encoder (RSC encoder 660) outputs the second parity bit stream $y'_k$.

Figure 7:
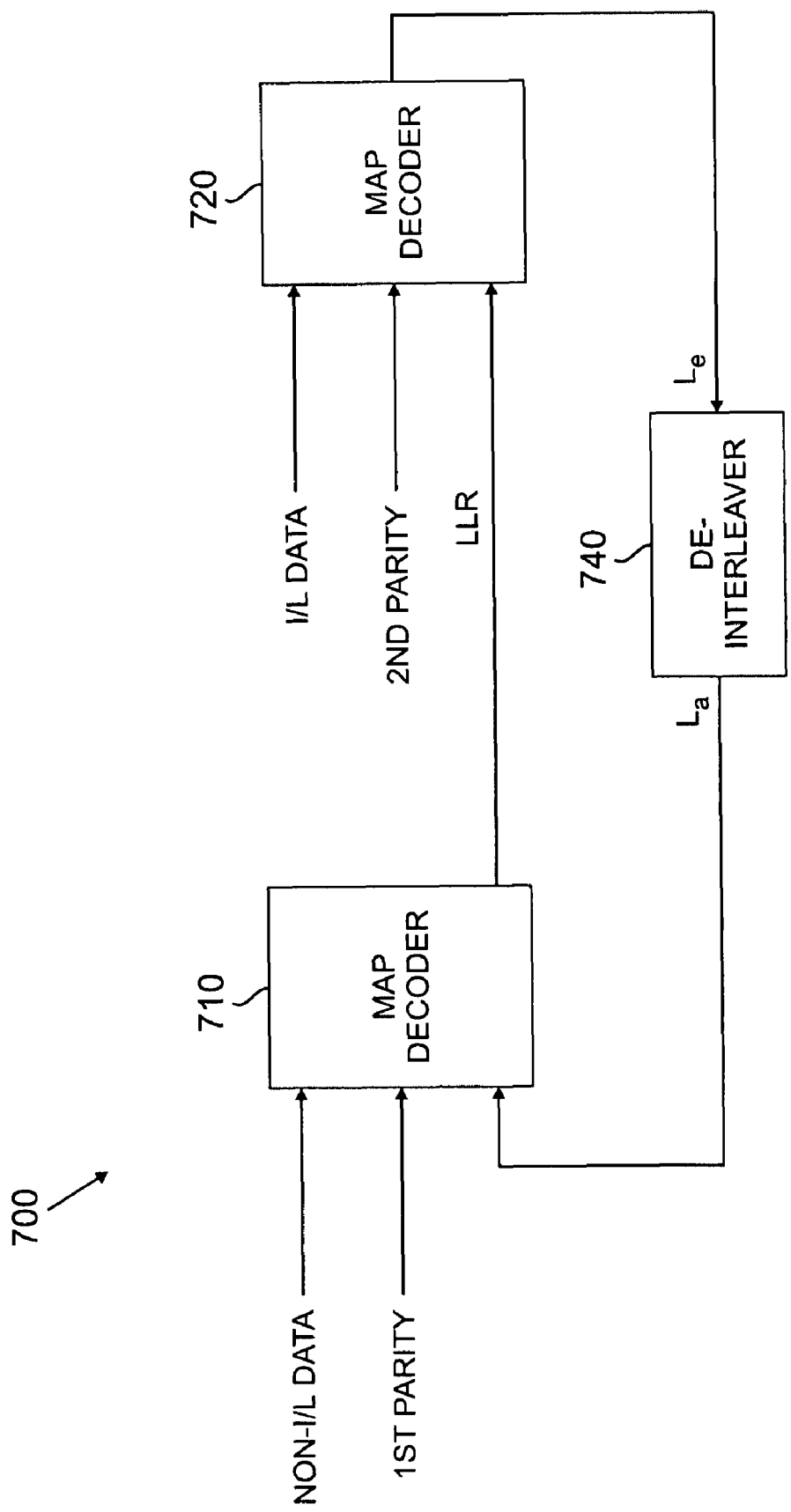
FIG. 7 is a high-level block diagram illustrating a turbo decoder according to one embodiment of the disclosure.

FIG. 7 is a high-level block diagram illustrating turbo decoder 700 according to one embodiment of the present disclosure. Each one of processing units 430a-430d implements a turbo decoder similar to turbo decoder 700. Turbo decoder 700 comprises MAP decoder block 710, MAP decoder block 720, and de-interleaver block 740. MAP decoders 710 and 720 operate in an iterative manner. MAP decoder 720 generates a new sequence of soft decision outputs that are fed back to MAP decoder 710 via de-interleaver block 740. This process may be repeated several times to increase the reliability of the decoded sequence.

MAP decoder block 710 receives data samples (soft values) from the demodulator corresponding to the non-interleaved (non-I/L) original data bits (e.g., (a,b) or $x_k$ from FIGS. 6A and 6B), the first parity bits (e.g., (y,w) or $y_k$ from FIGS. 6A and 6B) processed by the first encoder (605 or 655) in the transmitter, and the input $L_a$, which is the extrinsic ($\lambda$) information from MAP decoder 720. MAP decoder block 710 uses the original data bits and the first parity bits to estimate the probability, or log likelihood ratio (LLR), that the value of each original data bit is a Logic 1 or a Logic 0. MAP decoder block 720 receives data samples (soft values) from the demodulator corresponding to the interleaved (I/L) original data bits (e.g., interleaved (a,b) or interleaved $x_k$ from FIGS. 6A and 6B), the second parity bits (e.g., (y',w') or $y'_k$ from FIGS. 6A and 6B) processed by the second encoder (610 or 660), and the probability estimates (LLR) from MAP decoder block 710.

The process of decoding by MAP decoder blocks 710 and 720 comprises one iteration of turbo decoder 700. Turbo decoder 700 may perform a fixed number of iterations or half iterations or may perform iterations until some external mechanism determines that additional iterations will not improve the bit error rate (BER) for a particular data frame. A hard decision is then made on the last soft outputs to determine the original data bits.

As is well known, a MAP algorithm is a trellis decoding algorithm, similar to the Viterbi algorithm. The MAP algorithm within the two decoder blocks 710 and 720 operates on soft inputs (i.e., the demodulator outputs and the probability estimates) and produces soft outputs. The following description summarizes the MAP algorithm computations performed by one iteration of one decoder block. It should be noted that the example of the turbo decoder processes two input symbols at a time. In the case of duo-binary code (e.g., WiBro mode), the two input symbols to turbo decoder 700 are a, b, y, w, y' and w' from a single time sample. In the case of binary code (e.g., WCDMA mode), the inputs to the turbo decoder are $x_1$, $y_1$, and $y'_1$ from a first time sample and $x_2$, $y_2$, and $y'_2$ from a second time sample. Processing two input symbols at a time requires a radix-4 trellis mechanism, as shown in FIG. 5.

In a first step, a conventional MAP algorithm may compute and store branch metrics, called gamma (or $\gamma$) values, for all branches of the trellis. Alternatively, in the first step, the MAP algorithm may perform an "on-the-fly" calculation of the branch metric for each alpha stage or beta stage. The branch metrics are the exponentials of the negatives of the distances between the hard encoder values and the soft received values from the demodulator, divided by the channel noise variance, multiplied by the probability estimate from the previous decoder. In the logarithmic domain, the branch metric (gamma) values are merely the summation of the above parameters.

In a second step, the conventional MAP algorithm performs a forward recursion on the trellis. The forward recursion computes an alpha (or $\alpha$) value for each node in the trellis. The $\alpha$ value is the sum of: i) the previous $\alpha$ value times the branch metric along one branch from a previous node, ii) the previous $\alpha$ value times the branch metric along another branch from a previous node, iii) the previous $\alpha$ value times the branch metric along one branch from another previous node, and iv) the previous $\alpha$ value times the branch metric along another branch from a previous node. In the logarithmic domain, the alpha values are the summation of the above parameters and finding the survivor between the four candidates, as described below.

In a third step, the conventional MAP algorithm performs a backward recursion on the trellis. The backward recursion computes a beta (or $\beta$) value for each node in the trellis. The $\beta$ values are computed in a manner similar to the $\alpha$ values except that the backward recursion starts at the end of the trellis and progresses in the reverse direction.

In a fourth step, the conventional MAP algorithm computes the log likelihood ratio (LLR), or $\lambda$ (lambda) value, for each time t. In the case of a binary code, this value is the sum of the products of the $\alpha$, $\beta$, and $\gamma$ values for each branch at time t that is associated with a Logic 1 value in the encoder, divided by the sum of the products of the $\alpha$, $\beta$, and $\gamma$ values for each branch at time t that is associated with a Logic 0 value in the encoder. In the case of a duo-binary code, there are four $\lambda$ (lambda) values for each time t: $\lambda 00$, $\lambda 01$, $\lambda 10$ and $\lambda 11$. The $\lambda 00$ value is the sum of the products of the $\alpha$, $\beta$, and $\gamma$ values for each branch at time t that is associated with a Logic "00" value in the encoder. The $\lambda 01$ value is the sum of the products of the $\alpha$, $\beta$, and $\gamma$ values for each branch at time t that is associated with a Logic "01" value in the encoder. The $\lambda 10$ value is the sum of the products of the $\alpha$, $\beta$, and $\gamma$ values for each branch at time t that is associated with a Logic "10" value in the encoder. The $\lambda 11$ value is the sum of the products of the $\alpha$, $\beta$, and $\gamma$ values for each branch at time t that is associated with a Logic "11" value in the encoder.

Usually all lambdas are normalized by the L00 value and only three lambdas (L01, L10, and L11) are saved and used for the next half iteration. Finally, the conventional MAP algorithm computes the extrinsic information that is to be sent to the next decoder in the iteration sequence. For binary code (e.g., WCDMA), the extrinsic information is the LLR value minus the input probability estimate. The computations described above are repeated in each iteration by each of the two decoder blocks 710 and 720. After all iterations are completed, decoded information bits may be detected by making a decision on each data bit or data pair. Alternatively, in both codes, the LLR values may be output to an external device that makes a decision on each data bit or data pair. It will be understood that any other suitable MAP algorithm may be used without departing from the scope of this disclosure.

Figure 8:
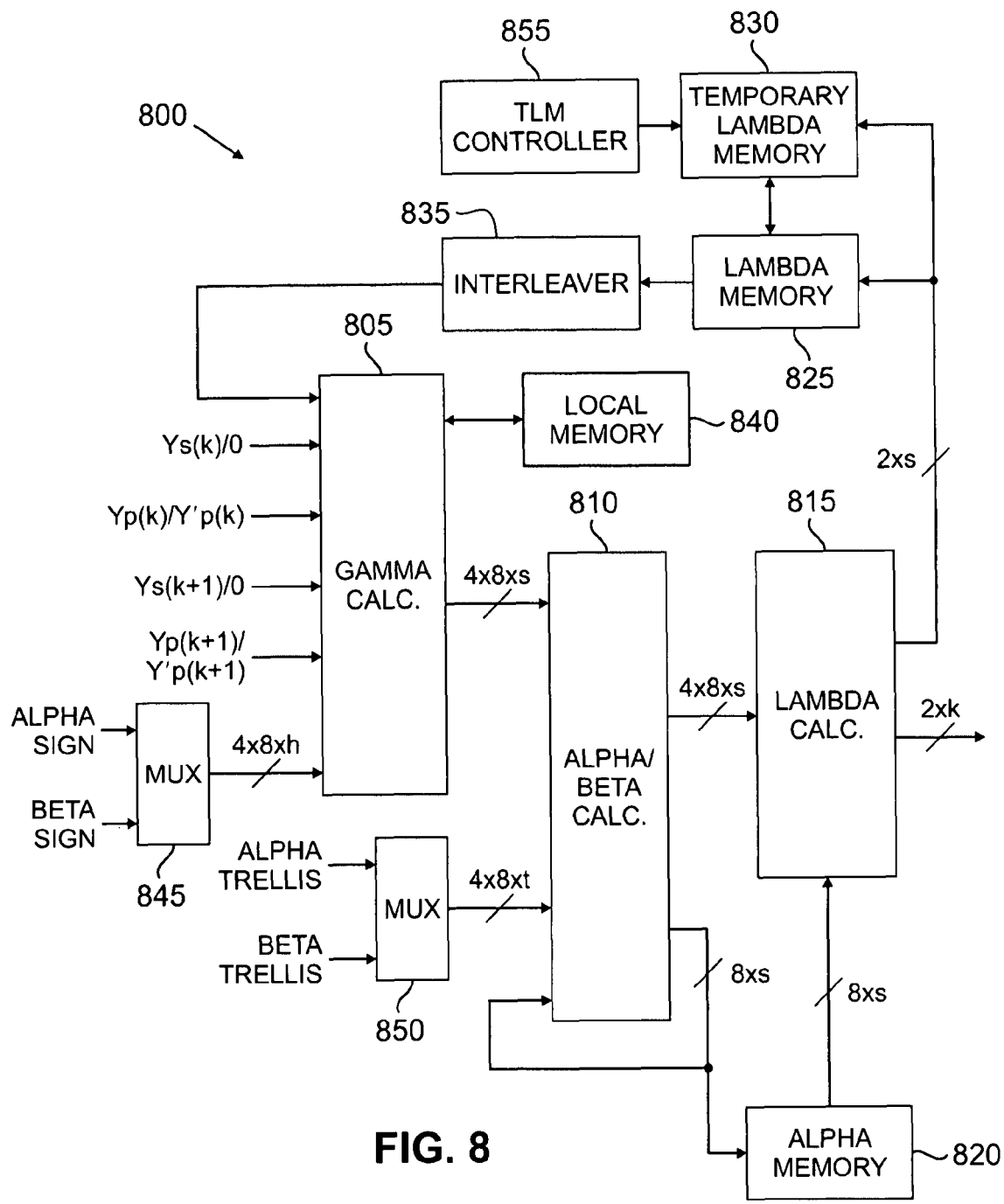
FIG. 8 is a high-level block diagram of a reconfigurable MAP decoder that is capable of providing increased throughput according to one embodiment of the disclosure.

FIG. 8 is a high-level block diagram of a reconfigurable MAP decoder 800, which may be used in WiBro mode, in WCDMA mode and/or in any other suitable mode. For one particular embodiment, the decoder 800 may comprise an LTE/W/CDMA MAP decoder such as the MAP decoder 710, for example.

MAP decoder 800 comprises gamma calculation block 805, alpha/beta calculation block stage 810, lambda calculation block 815, alpha memory 820, lambda memory 825, temporary lambda memory 830, interleaver 835, local memory 840, multiplexer 845, multiplexer 850, and temporary lambda memory (TLM) controller 855. The diagram of reconfigurable MAP decoder 800 is a generalized representation of the functions performed by various components in FIG. 4. For example, calculation blocks 810 and 815, multiplexers 845 and 850, and gamma calculation block 805 may be implemented in each of MAP datapaths 432a-d. Similarly, interleaver 835 may be implemented by communication switch 420, lambda memory 825 may be implemented by extrinsic information memories 445a-d 430, alpha memory 820 and/or temporary lambda memory 830 may be implemented by caches 433a-d, and so forth.

The reconfigurable and reprogrammable capabilities of MAP datapaths 432a-d and communication switch 420 (i.e., interleaver 835) enable reconfigurable MAP decoder 800 to operate in both duo-binary code (e.g., WiBro) systems and in binary code (e.g., WCDMA, HSDPA) systems.

MAP decoder 800 is operable to receive a plurality of data blocks for decoding and to divide each of those data blocks into a plurality of segments. As described in more detail below in connection with FIGS. 9 and 10, the decoding of the segments may be performed in an overlapping process that allows the processing of one segment to begin before the processing of a previous segment has ended.

Alpha/beta calculation block 810 performs the alpha ($\alpha$) calculations and the beta ($\beta$) calculations for both binary code mode and duo-binary code mode. No particular architecture is required for alpha/beta calculation block 810. However, alpha/beta calculation block 810 comprises an appropriate number of reconfigurable adders and comparators to perform the alpha and beta calculations.

The calculations of lambda ($\lambda$) may be performed by lambda calculation block 815 or, alternatively, may be divided across alpha/beta calculation block 810 and lambda calculation block 815 in both binary code mode and duo-binary code mode. Lambda calculation block 815 also comprises an appropriate number of reconfigurable adders and comparators to perform (along with alpha/beta calculation block 810) the lambda calculations.

During a forward recursion, gamma calculation block 805 calculates and stores the branch metrics (or gamma ($\gamma$) values) using: i) input symbol information, such as the duo-binary inputs (a, b) and the parity inputs (y, y', w, w'); and ii) extrinsic ($\lambda$) information in lambda memory 825 via interleaver 835. In trellis 500 in FIG. 5, there are eight states for each time slot (or input symbol) and four branches associated with each state, for a total of 32 branches. In the example described above, each soft input data sample comprises s=8 bits. Thus, the gamma output of gamma calculation block 805 is shown as 4×8×s. Gamma calculation block 805 also receives beta sign select and alpha sign select information via multiplexer 845. In the example, there are a total of h=4 sign select bits for each of the 4×8 branches shown in trellis 500. As noted above in FIG. 4, the gamma value may be stored in local memory 840 (e.g., cache 433) in order to reduce power consumption.

During a forward recursion, alpha/beta calculation block 810 calculates the alpha ($\alpha$) value for each node in trellis 500. Alpha/beta calculation block 810 receives the previous $\alpha$ value from alpha memory 820 (e.g., cache 433) and, as noted above, receives branch metric information ($\gamma$) from gamma calculation block 805. Alpha/beta calculation block 810 receives the alpha trellis information for each node via multiplexer 850. In the example, each of the eight trellis states in trellis 500 is represented by t=3 bits (i.e., 000-111). Since there are 4×8=32 branches associated with the eight trellis states, the alpha trellis information is shown as 4×8×t. Alpha/beta calculation block 810 stores the s=8 bit alpha values for each of the eight trellis nodes in alpha memory 820.

During a backward recursion, alpha/beta calculation block 810 calculates the beta ($\beta$) value for each node in trellis 500. The beta calculation process is very similar to the alpha calculation process. Alpha/beta calculation block 810 receives the previous $\beta$ value and receives branch metric information ($\gamma$) from gamma calculation block 805. Alpha/beta calculation block 810 receives the beta trellis information for each node via multiplexer 850. Like the alpha trellis information, the beta trellis information is shown as 4×8×t.

Alpha/beta, calculation block 810 may partially calculate the LLR ($\lambda$) values using the $\alpha$, $\beta$, and $\gamma$ values for each of the 32 branches in trellis 500. Lambda calculation block 815 performs, or alternatively completes, the calculation of the LLR value. In duo-binary mode, the 2×k output of lambda calculation block 815 may be a hard decision pair of bits (k=1) or a pair of soft values (k=16 bits) that are sent to an external circuit for a decision. As noted above, all lambda values may be normalized by the L00 value, such that lambda calculation block 815 only needs to store three s=16 bit values for L01, L10 and L11 in lambda memory 825.

The main issue for increasing the throughput in binary turbo, such as in LTE/WCDMA/CDMA2000, is the reading and writing of the lambda values during gamma calculation and lambda calculation, respectively. In the interleaved MAP decoding session, when matching the WCDMA rate to the WiMax rate (duo-binary), two lambdas need to be read and written simultaneously in order to achieve two cycles/bit/iteration performance in a single machine. However, parallel read/write of the two lambdas may not be possible unless the interleaver 835 is contention free for two consecutive interleaver bits, which is not the case in standards like WCDMA.

Therefore, in order to increase the number of lambdas that may be read and/or written for each segment, a portion of the lambdas for a particular segment may be read while a preceding segment is being processed and/or a portion of the lambdas may be written while a subsequent segment is being processed. The lambdas to be written while the subsequent segment is being processed may be stored temporarily in temporary lambda memory 830. For one embodiment, TLM controller 855 may be operable to control temporary lambda memory 830. For example, TLM controller 855 may be operable to write the second portion of lambda values that have been stored in temporary lambda memory 830 to lambda memory 825 during the subsequent segment. It will be understood that TLM controller 855 may be implemented as part of any other suitable component of decoder 800. Temporary lambda memory 830 may be included as part of alpha memory 820 or may be implemented as a separate memory.

For a particular embodiment, the portion of lambdas read before processing the current segment is half the lambdas and the portion of lambdas written after processing the current segment is half the lambdas. For this embodiment, temporary lambda memory 830 comprises a size that is equal to half the size of one segment of a data block, which is generally relatively small. As a result, temporary lambda memory 830 consumes only a limited amount of memory as compared to lambda memory 825, which may be operable to store an entire data block. It will be understood that the portion of lambdas read and/or written before or after processing the current segment may comprise any suitable portion.

As described in more detail below in connection with FIGS. 9 and 10, the reading of lambda values is done in a pipeline method. Thus, while calculating the beta values for a preceding segment, the first half (or other suitable portion) of the lambda values for a current segment is read from lambda memory 825 and stored in local memory 840. For this embodiment, the lambda values may be read in any order. In addition, for one embodiment, the lambda addresses may be saved while the lambdas are being read in order to allow the lambda addresses to be re-used when the lambdas are written. This embodiment reduces the amount of interleaver hardware by implementing a lambda address memory operable to store the lambda addresses for one segment.

While calculating the gamma and alpha values for the current segment, the second half (or other suitable portion) of the lambda values is read from lambda memory 825 and used together with the saved and restored first half of the lambda values from local memory 840 to calculate the gamma and alpha values. The second half of lambda values is also saved in local memory 840 for the calculation of beta values. The lambda values and/or the gamma values may be stored in local memory 840 and either the lambda values or the gamma values may be used in calculating beta values. Thus, either the lambda values or the gamma values may be restored from local memory 840 for the beta calculation.

While calculating the new lambda values, half (or other suitable portion) of the lambda values is written to lambda memory 825 and half (or other suitable portion) is stored in temporary lambda memory 830. While calculating the gamma and alpha values for a subsequent segment, the second half (or other suitable portion) of the lambda values is restored from temporary lambda memory 830 and written to lambda memory 825. In this way, any binary-based turbo decoder 800 can achieve N-bit based turbo performance even though the binary interleaver 835 is not contention-free for two or more consecutive interleaver bits.

Figure 9:
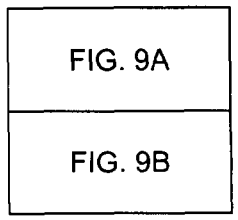
FIG. 9 is an example of a scheduling system for increasing throughput in the decoder of FIG. 8 according to one embodiment of the disclosure.
Figure 9A:
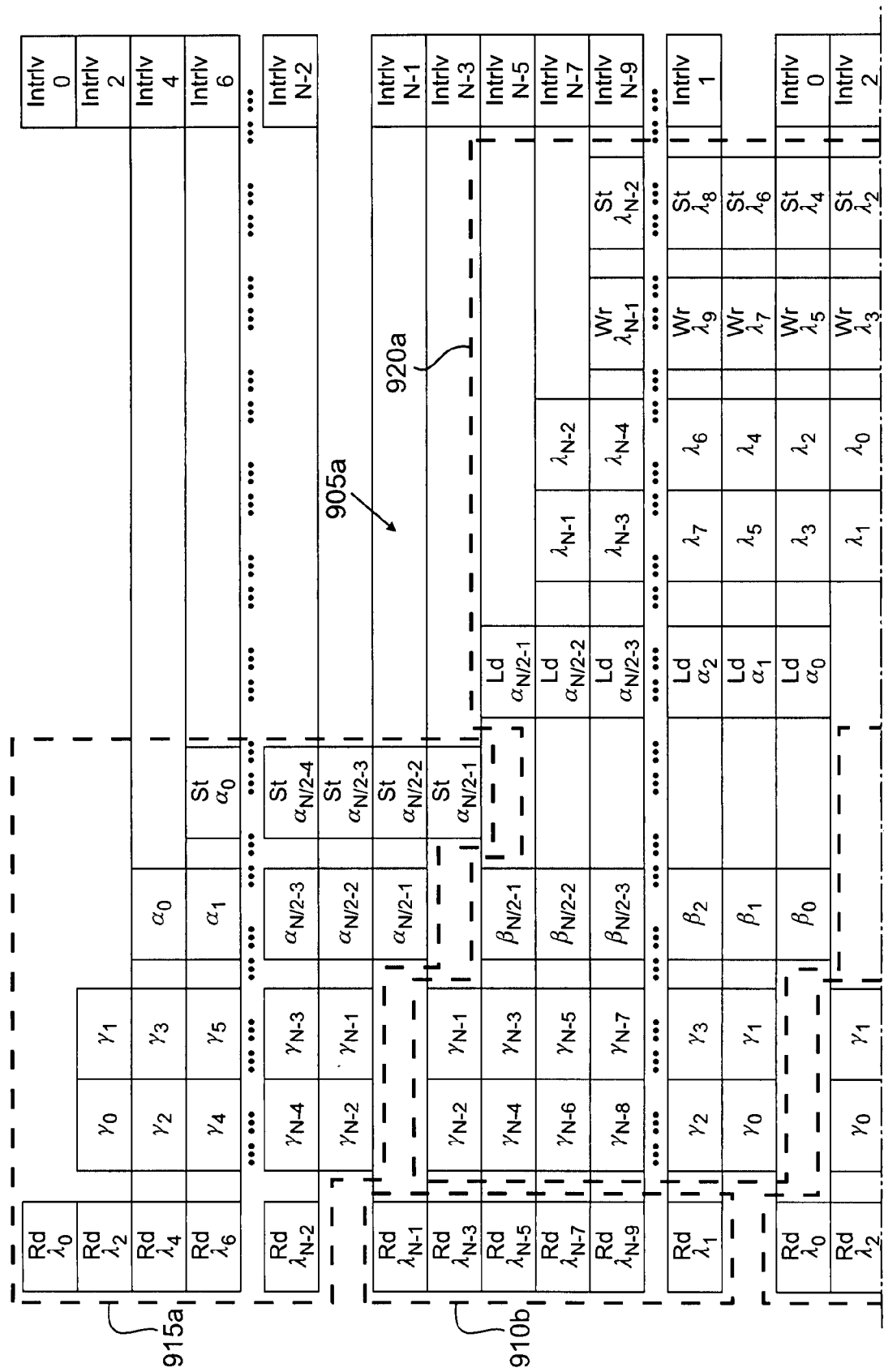
Figure 9B:
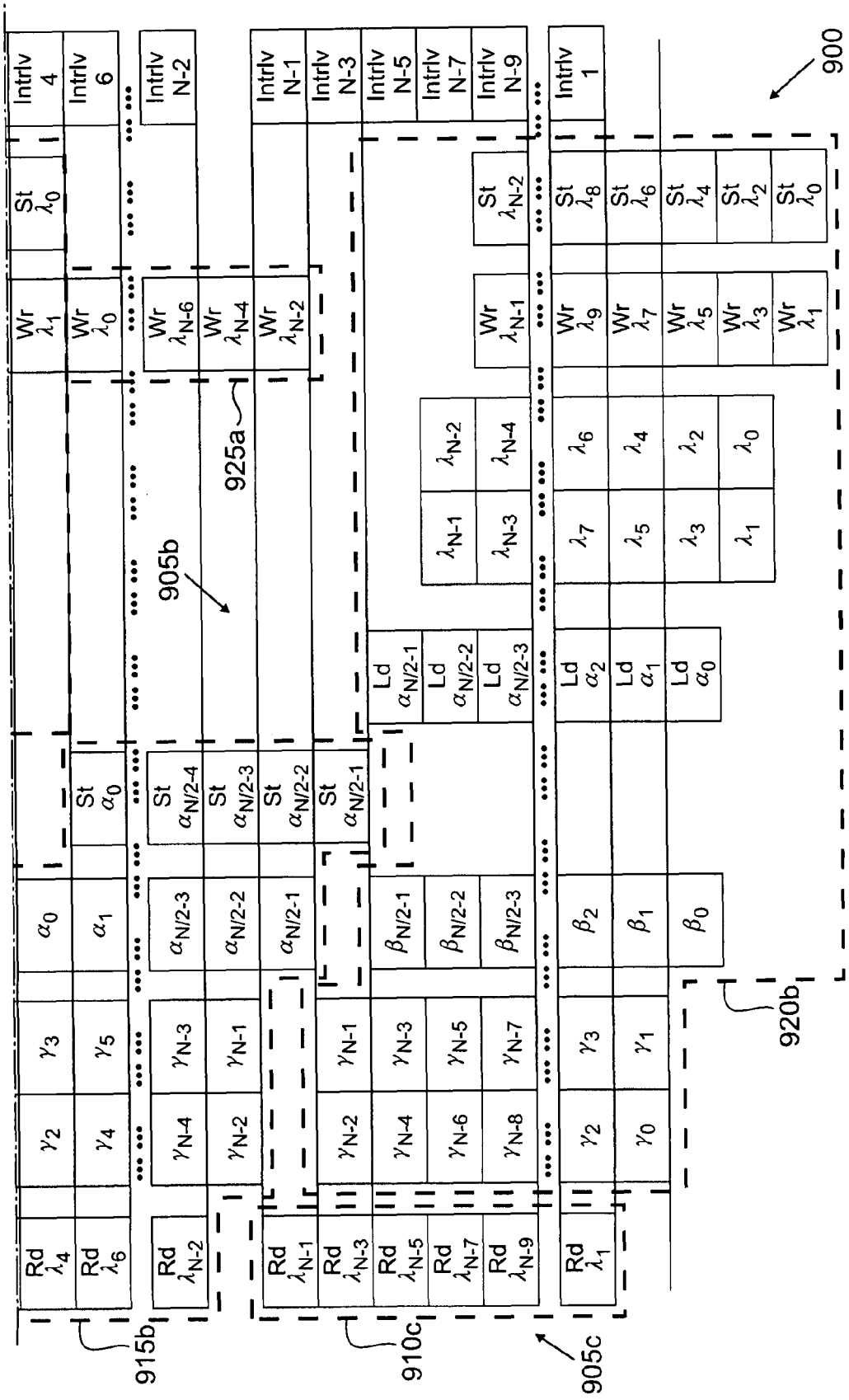

FIG. 9, which is illustrated as FIGS. 9A and 9B, is an example of a scheduling system 900 for increasing throughput in the decoder 800 according to one embodiment of the disclosure. For the illustrated embodiment, the scheduling of a plurality of segments 905a-c is shown. Although at least a portion of three segments 905a-c are shown, however, it will be understood that each data block may be divided into any suitable number of segments 905 for processing. Segment 905a is shown in white, segment 905b is shown in light gray, and segment 905c is shown in dark gray. When the current segment comprises segment 905a, segment 905b comprises the subsequent segment. Similarly, when the current segment comprises segment 905b, segment 905a comprises the preceding segment and segment 905c comprises the subsequent segment.

The scheduling of each segment 905a-c provides for four processes: a pre-calculation process 910, a first calculation process 915, a second calculation process 920, and a post-calculation process 925. For each segment 905, a process may overlap with an adjacent process such that a subsequent process may begin before a current process has ended. For example, as illustrated in FIG. 9, the first calculation process 915 overlaps with the second calculation process 920. In addition, processing of each segment 905 overlaps, as described below.

For the following description, which is based on the illustrated embodiment, the portion of lambda values read or written during each process comprises half. However, as described above, any suitable portion may be read or written during each process. In addition, although the illustrated embodiment provides for reading odd lambdas during the pre-calculation process 910 and even lambdas during the first calculation process 915, it will be understood that the lambdas may be divided between these processes 910 and 915 in any suitable manner. For example, even lambdas may be read during the pre-calculation process 910 and odd lambdas may be read during the first calculation process 915.

During the pre-calculation process 910, the first half of the lambda values for a current segment 905 is read from lambda, memory 825 and stored in local memory 840. During the first calculation process 915, the second half of the lambda values for the current segment 905 is read from lambda memory 825 and stored in local memory 840. Also during the first calculation process 915, the gamma values and the alpha values are calculated and stored in local memory 840 and alpha memory 820, respectively.

During the second calculation process 920, the gamma values are restored from local memory 840, the beta values are calculated, the alpha values are loaded from alpha memory 820, and the new lambda values are calculated. Also during the second calculation process, the first half of the new lambda values are written to lambda memory 825, while the second half of the new lambda values are stored in temporary lambda memory 830. During the post-calculation process 925, the second half of the new lambda values that were stored in temporary lambda memory 830 are written to lambda memory 825.

As illustrated, the scheduling for each segment 905 overlaps with the scheduling for adjacent segments 905. As an example, using segment 905b as the current segment, the pre-calculation process 910b for segment 905b is performed along with the second calculation process 920a for segment 905a. Then, the first calculation process 915b for segment 905b is performed along with the post-calculation process 925a for segment 905a.

Next, the second calculation process 920b for segment 905b is performed along with the pre-calculation process 910c for segment 905c. Although not shown in FIG. 9, the post-calculation process for segment 905b is performed along with the first calculation process for segment 905c. This scheduling may be seen, however, with regard to segment 905a: the post-calculation process 925a for segment 905a is performed along with the first calculation process 915b for segment 905b.

Figure 10:
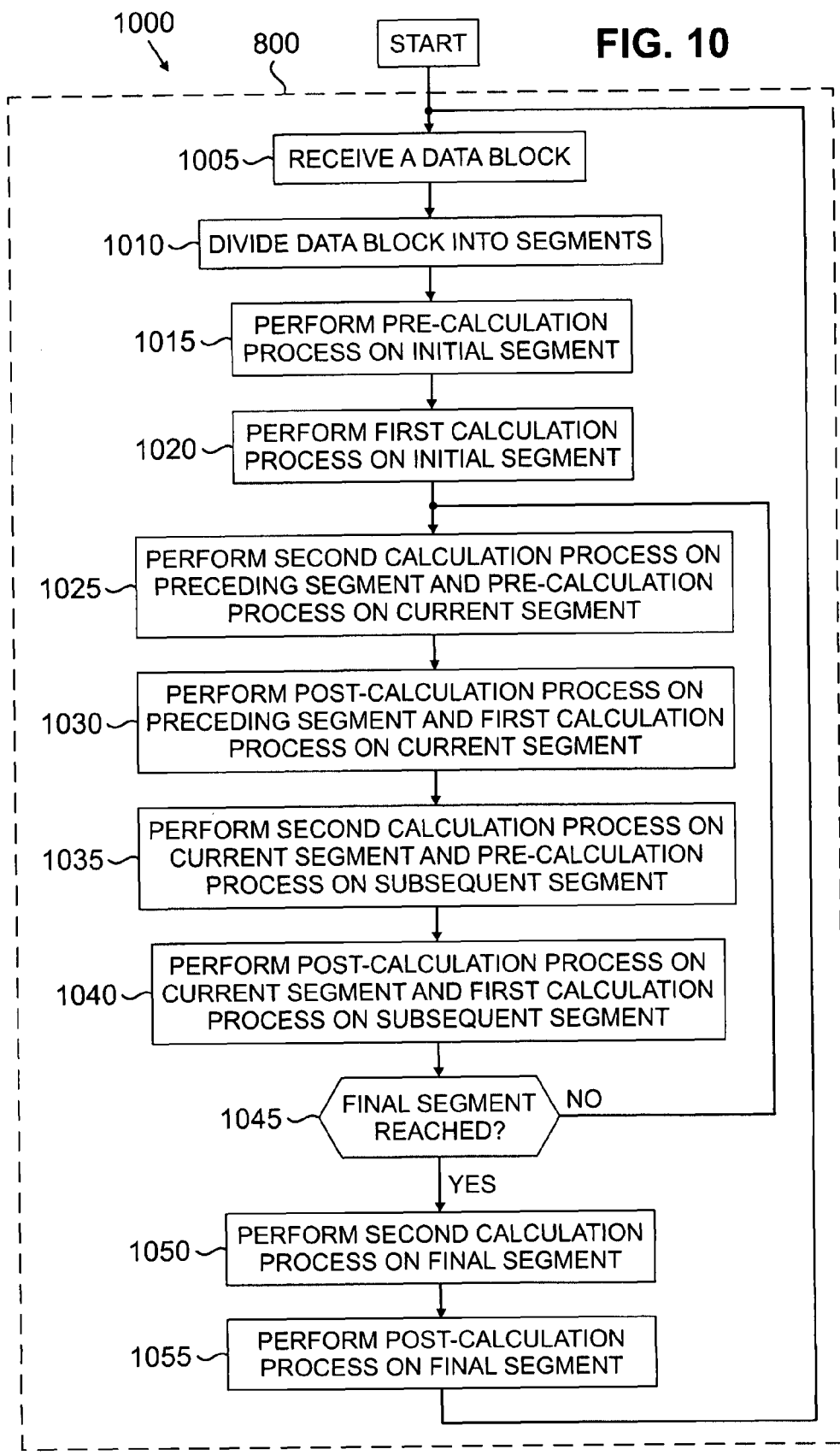
FIG. 10 is a flow diagram illustrating a method for increasing throughput for the decoder of FIG. 8 according to one embodiment of the disclosure.

FIG. 10 is a flow diagram illustrating a method 1000 for increasing throughput for the decoder 800 according to one embodiment of the disclosure. Although described as discrete steps in a particular order, it will be understood that the processes performed on segments of data blocks described below may overlap with each other. For example, a second calculation process that is described as occurring after a first calculation process may begin before the first calculation process is completed, as described above in connection with the scheduling system 900 of FIG. 9.

Initially, the decoder 800 receives a data block to be decoded (process step 1005). The decoder 800 divides the data block into a specified number of segments 905 (process step 1010). The decoder 800 then performs a pre-calculation process 910 on the initial segment 905 (process step 1015). The pre-calculation process 910 comprises reading a first portion of the lambda values for the segment 905. For one embodiment, the pre-calculation process 910 comprises reading the first half of the lambda values for the segment 905.

The decoder 800 then performs a first calculation process 915 on the initial segment 905 (process step 1020). The first calculation process 915 may comprise calculating gamma values and alpha values for the segment 905. The first calculation process 915 also comprises reading a second portion of the lambda values for the segment 905. For one embodiment, the first calculation process 915 comprises reading the second half of the lambda values for the segment 905.

For each succeeding segment 905 other than a final segment 905, the decoder 800 performs steps 1025, 1030, 1035 and 1040. The decoder 800 performs a second calculation process 920 on a preceding segment 905 and the pre-calculation process 910 on a current segment 905 (process step 1025). For the first iteration, the preceding segment 905 corresponds to the initial, or first, segment 905 and the current segment 905 corresponds to a second segment 905. The second calculation process 920 may comprise calculating beta values and lambda values for the segment 905. The second calculation process 920 also comprises writing a first portion of the calculated lambda values for the segment 905 to lambda memory 825 and storing a second portion of the calculated lambda values for the segment 905 in temporary lambda memory 830. For one embodiment, the second calculation process 920 comprises writing the first half of the lambda values for the segment 905 to lambda memory 825 and storing the second half of the lambda values for the segment 905 in temporary lambda memory 830.

The decoder 800 then performs a post-calculation process 925 on the preceding segment 905 and the first calculation process 915 on the current segment 905 (process step 1030). The post-calculation process 925 comprises writing the second portion of the lambda values for the segment 905 from temporary lambda memory 830 to lambda memory 825. For one embodiment, the post-calculation process 925 comprises writing approximately the second half of the lambda values for the segment 905 from temporary lambda memory 830 to lambda memory 825.

The decoder 800 performs the second calculation process 920 on the current segment 905 and the pre-calculation process 910 on a subsequent segment 905 (process step 1035). For the first iteration, the subsequent segment 905 corresponds to the third segment 905. The decoder 800 then performs the post-calculation process 925 on the current segment 905 and the first calculation process 915 on the subsequent segment 905 (process step 1040). After returning to step 1025 for each segment 905 other than the final segment 905 (process step 1045), the subsequent segment 905 in steps 1035 and 1040 for the previous iteration corresponds to the preceding segment 905 in steps 1025 and 1030 for the next iteration.

Once the decoder 800 reaches the final segment 905 of the data block (process step 1045), the decoder 800 performs the second calculation process 920 on the final segment 905 (process step 1050) and then performs the post-calculation process 925 on the final segment 905 (process step 1055). At this point, the decoder 800 may receive another data block (process step 1005) and the method continues as before as long as data blocks are being received.

In this way, the MAP decoder throughput may be doubled using a single MAP decoder SDR machine, such as MAP decoder 800, allowing the same throughput as a WiMax/WiBro turbo decoder to be achieved (i.e., two cycles/bit/iteration). With the above proposed method, any binary-based turbo decoder may achieve N-bit based turbo performance, even though the binary interleaver may not be contention free for two or more consecutive interleaver bits. In addition, a similar method may be performed for an N-bit binary machine that needs to read and write N lambdas in one cycle and that comprises an interleaver that is not N-bit contention free.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method for increasing decoder throughput, comprising:
   dividing a data block into a plurality of segments;
   for each of the segments, decoding the segment by performing a plurality of processes for the segment; and
   performing at least one process for a current segment that comprises reading a portion of previous lambda values for the current segment while performing at least one process for a preceding segment that comprises writing a portion of lambda values for the preceding segment.

2. The method as set forth in claim 1, decoding the segment by performing a plurality of processes for the segment comprising decoding the segment by performing a pre-calculation process, a first calculation process, a second calculation process, and a post-calculation process for the segment.

3. The method as set forth in claim 2, performing at least one process for the current segment while performing at least one process for the preceding segment comprising performing the pre-calculation process for the current segment while performing the second calculation process for the preceding segment.

4. The method as set forth in claim 3, performing at least one process for the current segment while performing at least one process for the preceding segment further comprising performing the first calculation process for the current segment while performing the post-calculation process for the preceding segment.

5. The method as set forth in claim 2, further comprising performing at least one process for the current segment while performing at least one process for the subsequent segment, comprising performing the post-calculation process for the current segment while performing the first calculation process for the subsequent segment.

6. The method as set forth in claim 5, performing at least one process for the current segment while performing at least one process for the subsequent segment further comprising performing the second calculation process for the current segment while performing the pre-calculation process for the subsequent segment.

7. The method as set forth in claim 2, the pre-calculation process comprising reading a first portion of a previous set of lambda values for the segment, the first calculation process comprising reading a second portion of the previous set of lambda values for the segment, the second calculation process comprising writing a first portion of a next set of lambda values for the segment, and the post-calculation process comprising writing a second portion of the next set of lambda values for the segment.

8. The method as set forth in claim 7, the first portion of the previous set of lambda values comprising about 50% of the previous set of lambda values, the second portion of the previous set of lambda values comprising about 50% of the previous set of lambda values, the first portion of the next set of lambda values comprising about 50% of the next set of lambda values, and the second portion of the next set of lambda values comprising about 50% of the next set of lambda values.

9. The method as set forth in claim 7, the first calculation process further comprising calculating a set of gamma values and a set of alpha values, and the second calculation process further comprising calculating a set of beta values and the next set of lambda values and temporarily storing the second portion of the next set of lambda values.

10. A method for increasing decoder throughput, comprising:
dividing a data block into a plurality of segments;
for each of the segments, decoding the segment by performing a plurality of processes for the segment, the processes comprising a pre-calculation process, a first calculation process, a second calculation process, and a post-calculation process;
performing the pre-calculation process for a current segment while performing the second calculation process for a preceding segment; and
performing the post-calculation process for the current segment while performing the first calculation process for a subsequent segment.

11. The method as set forth in claim 10, further comprising:
performing the first calculation process for the current segment while performing the post-calculation process for the preceding segment; and
performing the second calculation process for the current segment while performing the pre-calculation process for the subsequent segment.

12. The method as set forth in claim 11, the pre-calculation process comprising reading a first portion of a previous set of lambda values for the segment.

13. The method as set forth in claim 12, the first calculation process comprising reading a second portion of the previous set of lambda values for the segment.

14. The method as set forth in claim 13, the first portion of the previous set of lambda values comprising about 50% of the previous set of lambda values, and the second portion of the previous set of lambda values comprising about 50% of the previous set of lambda values.

15. The method as set forth in claim 13, the first calculation process further comprising calculating a set of gamma values and a set of alpha values.

16. The method as set forth in claim 11, the second calculation process comprising calculating a next set of lambda values and writing a first portion of the next set of lambda values.

17. The method as set forth in claim 16, the post-calculation process comprising writing a second portion of the next set of lambda values.

18. The method as set forth in claim 17, the first portion of the next set of lambda values comprising about 50% of the next set of lambda values, and the second portion of the next set of lambda values comprising about 50% of the next set of lambda values.

19. The method as set forth in claim 17, the second calculation process further comprising calculating a set of beta values and temporarily storing the second portion of the next set of lambda values.

20. A system for increasing decoder throughput, comprising:
a lambda calculation block configured to calculate a plurality of lambda values for use in decoding each of a plurality of segments of a data block;
a lambda memory coupled to the lambda calculation block, the lambda memory configured to store the lambda values calculated by the lambda calculation block; and
a temporary lambda memory coupled to the lambda calculation block and to the lambda memory, the temporary lambda memory configured to store temporarily a portion of the lambda values calculated by the lambda calculation block,
wherein the lambda calculation block calculates a new set of lambda values associated with a previous segment while previous lambda values associated with a current segment are read from the lambda memory.

21. The system as set forth in claim 20, further comprising an interleaver coupled to the lambda memory, the interleaver configured to read a first portion of the previous set of lambda values associated with the current segment from the lambda memory during a pre-calculation process for the current segment and to read a second portion of the previous set of lambda values associated with the current segment from the lambda memory during a first calculation process for the current segment.

22. The system as set forth in claim 21, the first portion of the previous set of lambda values comprising about 50% of the previous set of lambda values, and the second portion of the previous set of lambda values comprising about 50% of the previous set of lambda values.

23. The system as set forth in claim 21, the lambda calculation block further configured to calculate a new set of lambda values associated with the current segment, write a first portion of the new set of lambda values associated with the current segment to the lambda memory, and store a second portion of the new set of lambda values associated with the current segment in the temporary lambda memory during a second calculation process for the current segment.

24. The system as set forth in claim 23, further comprising a temporary lambda memory (TLM) controller coupled to the temporary lambda memory, the TLM controller configured to write the second portion of the new set of lambda values associated with the current segment from the temporary lambda memory to the lambda memory during a post-calculation process for the current segment.

25. The system as set forth in claim 24, the first portion of the new set of lambda values comprising about 50% of the new set of lambda values associated with the current segment, and the second portion of the new set of lambda values comprising about 50% of the next set of lambda values associated with the current segment.

26. The system as set forth in claim 25, the temporary lambda memory comprising a size that is equivalent to 50% of a size of each segment.

27. The system as set forth in claim 23, further comprising:
an alpha/beta calculation block coupled to the lambda calculation block; and
a gamma calculation block coupled to the alpha/beta calculation block, the gamma calculation block configured to calculate a set of gamma values during the first calculation process, the alpha/beta calculation block configured to calculate a set of alpha values based on the set of gamma values during the first calculation process and to calculate a set of beta values based on the set of gamma values during the second calculation process, and the lambda calculation block configured to calculate the lambda values based on the alpha values and the beta values.

* * * * *